March 28, 1961 F. K. CLARKE ET AL 2,977,515

SEMICONDUCTOR FABRICATION

Filed May 7, 1958 3 Sheets-Sheet 1

INVENTORS
FORD K. CLARKE
WALTER L. DOELP JR.
BY
Carl H. Sigmuntowell
AGENT

INVENTORS
FORD K. CLARKE
WALTER L. DOELP JR.
BY
Carl H. Lymnestvedt
AGENT

SEMICONDUCTOR FABRICATION

Filed May 7, 1958

INVENTORS
FORD K. CLARKE
WALTER L. DOELP JR.
BY
Carl H. Synnestvedt
AGENT

United States Patent Office 2,977,515

Patented Mar. 28, 1961

2,977,515

SEMICONDUCTOR FABRICATION

Ford K. Clarke, Chalfont, and Walter L. Doelp, Jr., Doylestown, Pa., assignors to Philco Corporation, Philadelphia, Pa., a corporation of Pennsylvania Filed May 7, 1958, Ser. No. 733,613

3 Claims. (Cl. 317—234)

This invention relates to semiconductor devices.

The invention while of broader applicability is especially useful in the fabrication of semiconductor devices having medium power application. Accordingly, and with the foregoing qualification in mind, the objects sought to be attained and those features characteristic of the invention will be described in relation to the fabrication of a wafer type, medium power, alloy junction transistor.

Semiconductor devices are known in the prior art which employ so-called alloy-junctions as the active elements thereof, for example as the emitter or collector elements of transistors. Such alloy-junctions may be fabricated by applying a body of suitable activator metal to the surface of a semiconductive body of predetermined conductivity-type, and then heating the metal sufficiently to cause it to melt and to alloy with the underlying portion of the semiconductive body. On subsequent cooling and solidification, the semiconductive material in the alloy region recrystallizes upon the undissolved portion of the semiconductive body, the crystallized semiconductive material then containing minute traces of the activator metal sufficient in quantity and type to alter the conductivity type of the recrystallized region and to form a P–N junction and a rectifying barrier adjacent the inner boundary of the recrystallized region. Most of the activator metal solidifies in a body integral with, and on the external side of, the recrystallized region, this metal body ordinarily serving as the contact for the junction. Customarily a lead is attached to this metal contact to provide connection to external circuit elements. In the case of the transistor, a second alloy-junction is formed in similar manner in an opposing surface region of the semiconductive body, so as to produce a pair of confronting rectifying barriers within the body.

The extremely small size and fragile nature of such devices has posed a considerable problem in relation to their handling and processing during fabrication, a problem which has become increasingly more acute with each year's increasing emphasis on further miniaturization. Additionally, the generation of any appreciable energy within such a small device necessitates effective means for dissipating the generated power to avoid excessive thermal loading. Moreover the characteristic susceptibility of semiconductor devices to contamination makes mandatory the use of some type of encapsulation, a factor still further complicating the aforesaid considerations.

The presently recognized procedure for insuring optimum performance of semiconductor devices over a substantial period of time is to use encapsulating means of the type, for example, including a single ended, cup-shaped, metal envelope, which partially encloses the semiconductive device leaving one end open. This opening is subsequently sealed by a suitable closure, as for example a stem assembly comprising an insulating core or matrix of vitreous, ceramic or other suitable material, the insulating core or matrix being traversed by leads providing electrical accessibility to the encapsulated portions of the electrical system. Stem assemblies, as for example those commonly used in the manufacture of transistors, normally include an additional element in the form of a metallic eyelet, which surrounds, and is hermetically sealed to the glass core or bead, and which facilitates juncture of the stem assembly with the aforementioned metal envelope.

The optimum method of effecting juncture of the eyelet and can is to use some form of pressure welding commonly referred to as "cold welding." The reason being that other forms of closure, such as resistance welding, often result in the release of metal vapors which seriously contaminate the semiconductor and associated elements, and additionally produce damaging thermal gradients, which, if not carefully controlled, can deleteriously affect the delicate transistor assembly.

Soldering techniques, on the other hand, while not producing contaminants of the nature mentioned above, fail to provide an hermetic seal which will remain reliable under the extreme environmental conditions to which these units are customarily subjected.

Accordingly it is an object of this invention to provide improved means for the fabrication of semiconductor devices which facilitates both their handling and processing and which is adaptable to cold welding procedures.

It is another object of the invention to provide transistor support structure facilitating the independent handling of the semiconductor prior to its encapsulation and which permits, after encapsulating, effective dissipation of the heat generated within the semiconductive body.

A further object is to provide fabricating means adapted to mass production procedures which are both inexpensive and simple in application.

Other objects and features of the invention will be apparent from a consideration of the following detailed description taken in conjunction with the accompanying drawings, in which.

The invention, briefly described, relates to unique semiconductor fabricating means consisting of a mount of low thermal impedance which facilitates handling and processing of the semiconductor device and permits its subsequent hermetic enclosure by cold welding procedures. Moreover, the constructional features and mode of fabrication hereinafter described permit testing of the semiconductor independently of its housing, a technique insuring maximum yield with a minimum of expenditure of time and money.

Figure 1:
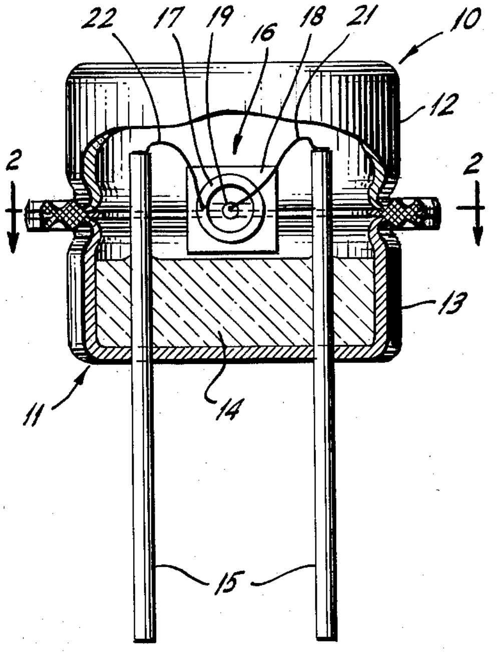
Figure 1 is an elevational view, partially in section, of a transistor assembly embodying features of the present invention.
Figure 2:
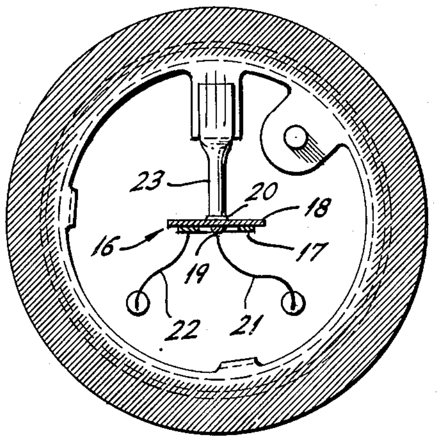
Figure 2 is a sectional view taken along the cutting plane 2—2 of Figure 1.

Now making detailed reference to the drawing, Figure 1 shows a transistor assembly 10 comprising an eyelet type stem assembly 11 and an overlying cap, hat, or encasing member 12. The stem eyelet 13 houses a core 14 of insulating material, such as glass, traversed by a plurality of leads 15 providing electrical accessibility to the transistor 16. A ring-type base tab 17 is secured to the emitter-bearing surface of the thin wafer of semiconductive material 18, which member has on opposed surface portions thereof an alloy emitter contact 19 and an alloy collector contact 20 (Figure 2). Electrical connection to the emitter contact 19 and base tab 17 is made, respectively, through filaments 21 and 22, the collector 20 being connected thermally and electrically to the housing in accordance with the present invention.

During normal operation of semiconductor devices a considerable quantity of heat is generated within the rectifying barrier regions of the device, specifically, in the case of transistors, at the collector junction. Consequently, it is desirable to provide a path of low thermal impedance from this heat source to an appropriate heat sink thereby effectively to decrease the temperature rise produced at the collector junction for each watt of dissipated power.

Figure 4:
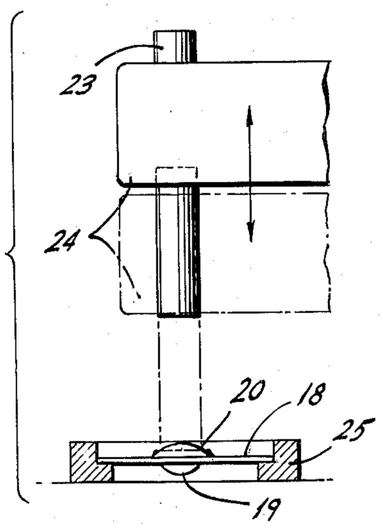
Figure 4 is a schematic showing, not necessarily to scale, depicting one method of transistor assembly.

In one form of the invention ohmic contact is made between a nickel plated silver stud 23 and the collector contact or pellet 20, as by soldering, in the manner shown in Figure 4. The prescribed procedure is to position the tinned stud 23 in the adjustable jaws of a translatable vise 24, in such manner that half the stud is retained within the vise jaws and the tinned half is below it. The alloyed blank 18, with the emitter side down is gently placed within a nest or fixture 25. To facilitate soldering a small amount of 2% HCL-propylene glycol flux is applied to the lower end of the stud with a glass applicator. Preferably the stud 23 is exactly concentrically aligned with the collector recrystallized region 20 of the transistor, a condition which may be achieved by manual manipulation or by positioning with a micromanipulator aided by microscopic examination. The stud and collector contact are then brought into abutment in the manner shown in phantom in Figure 4, and heat is applied to the stud in an amount sufficient to fuse the stud and the collector pellet, care being taken not to totally melt the collector pellet but to heat sufficiently to insure continuous contact throughout the interfacial area of junction.

Figure 5:
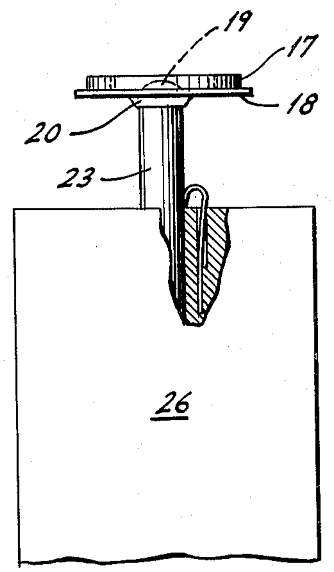
Figure 5 illustrates one convenient method of handling semiconductor devices manufactured in accordance with the invention.

With the stud attached, all subsequent processing is conveniently accomplished by using the stud 23 as a device whereby to handle the alloyed blank, one technique being to insert the stud into a fixture or chuck 26 shown in Figure 5, the fixture being of a size convenient for manual handling.

Stud mounting is normally followed by the attachment of filaments or whiskers 21 and 22 to the emitter and base, or base tab members respectively, ohmic contact being made by conventional soldering means. The filaments are about two mils in diameter and are preferably of nickel plated with an indium cadmium alloy of eutectic proportions to facilitate soldering. Leads of this general description have a low lead fatigue, that is to say, they have a high resistance to fatigue induced by flexure, in addition to being excellent electrical conductors.

Experience has shown that the reliability of a semiconductor device is directly proportional to the amount of care that is taken to keep the blank and filaments clean and free from all contaminants. It is therefore mandatory that the assembly be subjected to a rigorous clean-up prior to encapsulation and that control be exercised to maintain the assembly in its resulting uncontaminated state, up to and through its final encasement In consequence of this requirement the device, after stud soldering and emitter and base whiskering, is cleaned by etching, an extremely effective formulation consisting of a solution of 48% hydrofluoric acid, nitric acid and water in 5-5-1 proportions. With the alloy blank and stud conveniently held in a suitable chuck, as for example the one shown in Figure 5, the entire unit may be conveniently immersed in the solution just deep enough to cover the blank, or if desired a jet stream of etchant may be directed against the blank and the unit carefully manipulated under the stream so as to uniformly expose critical portions of the unit to the cleansing action. After etching, the blank is rinsed and then baked in a vacuum oven at an elevated temperature for a time insuring complete volitilization of all extraneous matter.

In order to insure optimum freedom from subsequent contamination, all fabricating procedures following the clean-up etch are accomplished in a controlled atmosphere.

The unique design of this device permits testing of the unit before it is mounted to the enclosure structure, a decided advance over prior art technique which require mounting of the unit to the stem as a requisite to testing, a procedure which results in loss of the stem and blank in the event of unit rejection for failure to meet prescribed operating standards, a factor which, in the light of present experience, gives rise to a loss, or "shrinkage," of some 20–30% of all units tested. Because of the delicate nature and size of these devices, even if the unit is not totally discarded, its reclamation is a costly and time consuming operation.

The construction shown eliminates this waste and, insures optimum yield by permitting testing of the unit prior to its attachment to the enclosing structure. Moreover, once tested its unique construction permits installation by cold welding procedures, insuring freedom from subsequent contamination.

Figure 3:
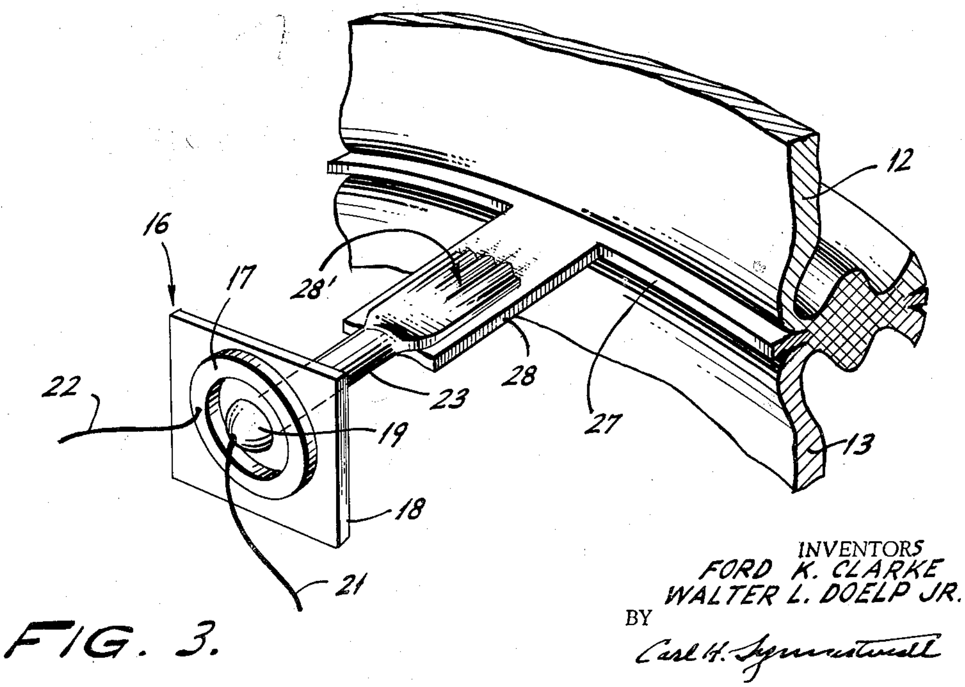
Figure 3 is an enlarged fragmentary view showing the preferred method of transistor attachment.
Figure 6:
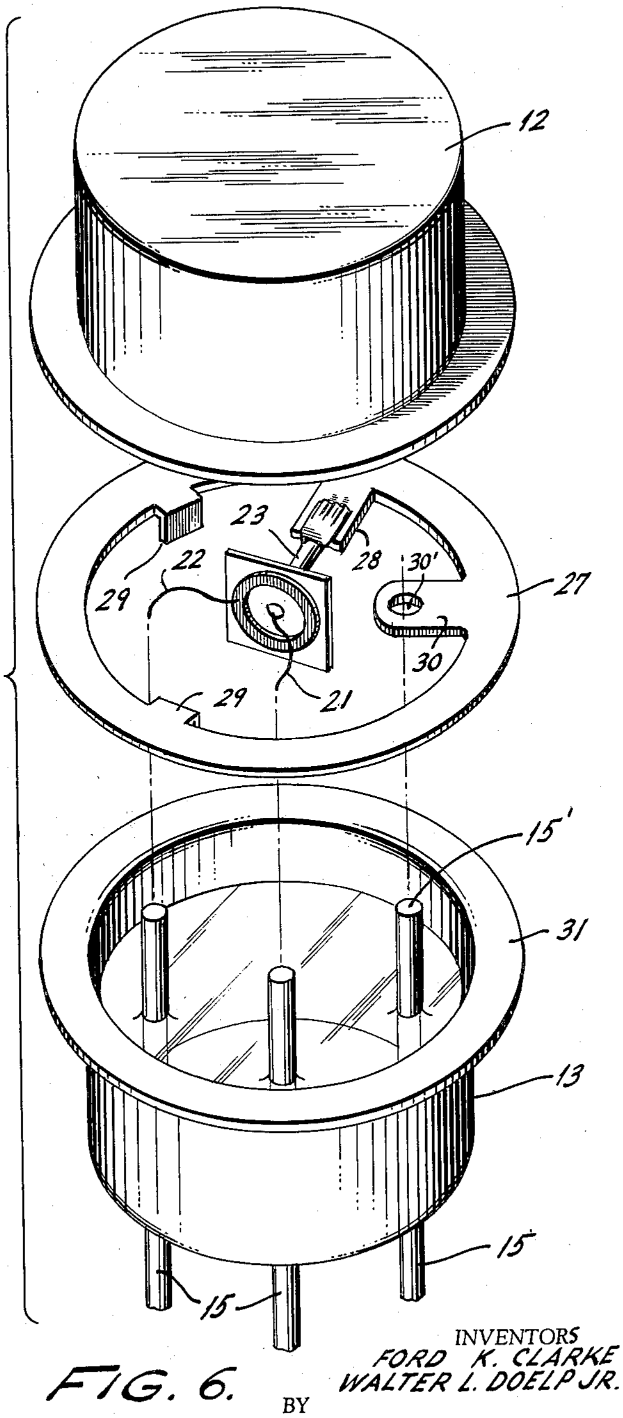
Figure 6 is an exploded view graphically showing the prescribed manner of fabricating a transistor, utilizing structure of the present invention.

This stud mounted assembly is then inserted into a hydraulic press, and the collector stud pressure-welded to the nickel-plated ring 27 in a controlled atmosphere. The high pressure applied induces plastic flow of the metal, portions of the inwardly extending radial rib 28 of the ring 27 being intimately intermingled with portions of the stud 23 located within the mating zone 28′, the juncture being shown clearly in Figure 3. The pressure weld releases no contaminating gases such as a hot weld might do and there is no consequent harm to the transistor 16. The depending tabs 29 and the apertured projection 30 enable the transistor carrying ring to be accurately seated on the stem eyelet 13, the collector lead 15′, shown in Figure 6, being positioned within the aperture 30′, and the tabs 29 brought into snug contact with inner surface portions of the eyelets' outwardly extending peripheral flange 31. With the ring accurately positioned the filaments are welded to their respective leads. As a precautionary measure the transistor may again be baked for one half hour at one hundred degrees C. after which the encasing member 13 is pressure welded to the mating cap 12 in the manner described in the copending application of K. R. Hales and H. Edwin Godshall bearing Serial No. 608,791, filed September 10, 1956, and assigned to the assignee of the present invention, the ring 27 being sandwiched in cold welded juncture between the confronting flanges of the encasing members. By mounting the alloy blank in this manner there is provided a direct conductive path of low thermal impedance from the collector junction to the metallic encasing structure. The considerable life data which has now been accumulated indicates that failure mechanisms in transistors, other than those of the catastrophic contamination variety, are brought about by chemical reactions or diffusion phenomena, conditions directly related to the operating junction temperature. It can be said that the life of the transistor will, in general, at least double for every ten degrees by which the operating junction temperature can be reduced. Units fabricated in accordance with this invention have been shown to experience a temperature rise of from 0.2 to 0.25 degree centigrade per milliwatt of dissipated power, while units of similar size employing conventional designs exhibit a temperature rise of from 4 to 5 times this value.

The heat generated within the transistor is conducted through the stud 23, tab 28 and ring 27 into the metal housing 12 and 13, thereby effectively utilizing the entire enclosure as a heat radiating member and heat sink.

Figures 7, 8, 9:
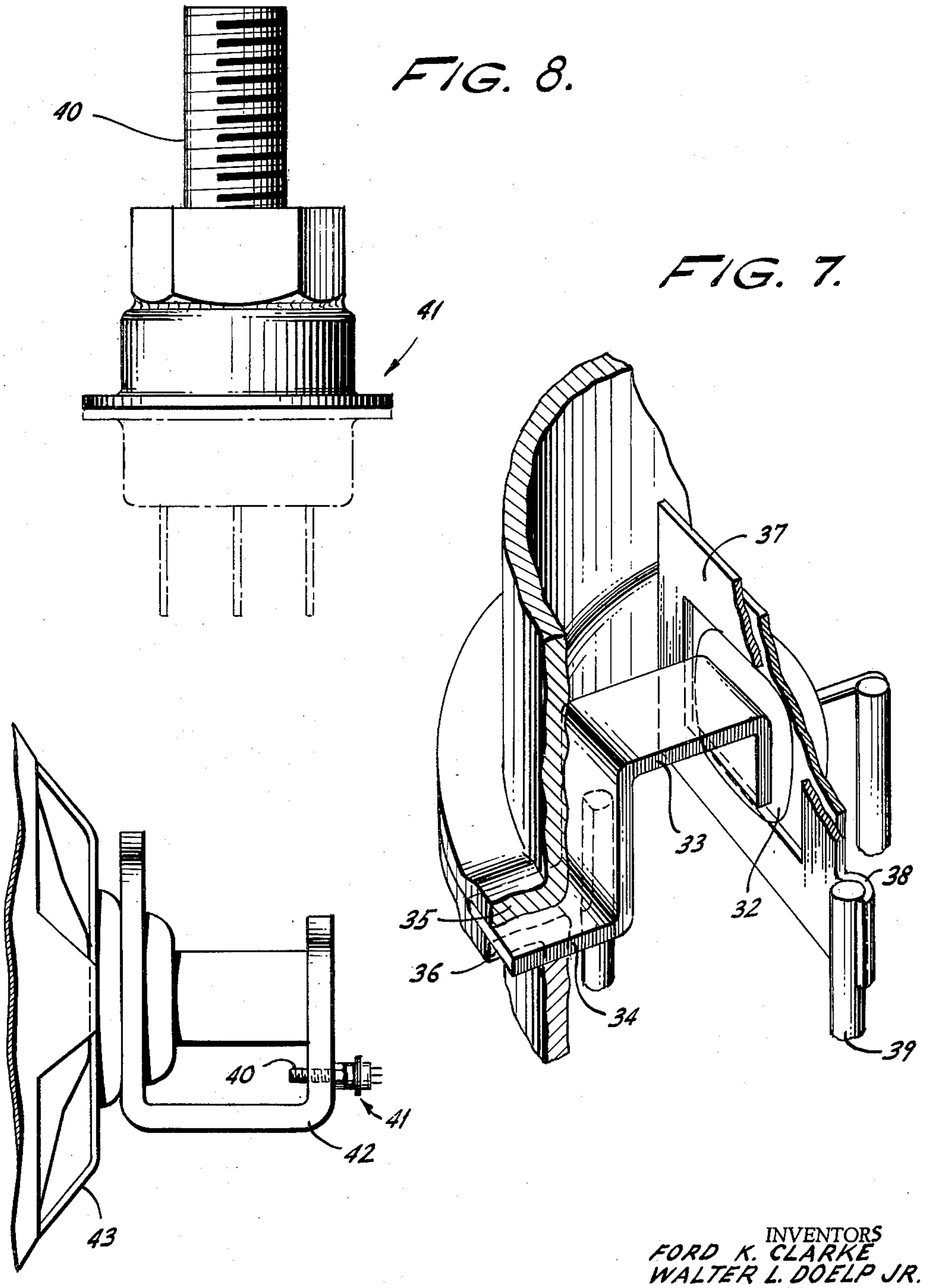
Figure 7 is a fragmentary showing of alternative support structure.
Figure 8 illustrates one convenient means of increasing the heat dissipation of devices employing structure of the type described.
Figure 9 shows one convenient means for increasing the thermal rating of such units.

In another embodiment of the invention, shown in Figure 7, the transistor is mounted by an attachment made to regions contiguous the emitter recrystallized region 32 by means comprising a wide, rectangular-cross-sectioned tab 33 adapted to provide support during initial processing and adapted for cold welding juncture to the encasing structure in much the same manner as previously described, and providing, on installation, a low thermal impedance path from the transistor to the metal housing. A terminal portion 34 of the tab is adapted for entrapment between confronting flange portions 35 and 36 of the encasing members, an arrangement providing effective and simplified thermal coupling between the transistor and enclosure. The window-frame type base tab 37 facilitates orientation of the transistor within the encasement by means shown, the extension 38 of the base tab making ohmic contact with the base lead 39.

One simple yet effective means of extending the power rating of semiconductors manufactured in accordance with the present invention is that shown in Figure 8. A threaded member 40, such as an ordinary machine screw, is mounted to the semiconductor encapsulating structure, as by soldering, and provides an efficient thermal coupling between the encapsulated unit and any desired external heat sink. One mode of mounting is shown in Figure 9, the transistor 41 being attached to the yoke 42 of a speaker 43.

While the invention has been described with particular reference to specific practice and embodiments, it will be understood by those skilled in the art that the invention is susceptible to changes and modifications without departing from the scope thereof, as defined in the appended claims.

We claim:

1. An encapsulated semiconductor device, comprising: a body of semiconductive material; structure defining an hermetic enclosure for said body, and individual, separately formed means supporting said body within said enclosure interposed in a mechanical connection between said body and enclosure, said latter means including an arcuately-shaped member joined in cold-welded juncture to heat conductive portions of said enclosure, said first mentioned means making contact to regions contiguous a rectifying barrier region of said body and forming a path of low thermal impedance between said region of said body and heat conductive portions of said enclosure.

2. An encapsulated semiconductor device, comprising: a body of semiconductive material; flanged members hermetically enclosing said body, and individual separately formed, elongate means joined at one of its ends to regions contiguous a rectifying barrier region of said body and secured at its opposite end to ring-like structure sandwiched in cold-welded juncture between flange portions of said members, the arrangement comprising said ring and elongate means providing effective thermal coupling between said region of said device and said enclosure.

3. An encapsulated semiconductor device, comprising: a body of semiconductive material; flanged members hermetically enclosing said body, and individual, separately formed, elongate means joined at one of its ends to regions contiguous a rectifying barrier region of said body and secured at its opposite end in cold-welded juncture between flange portions of said members to provide effective thermal coupling between said region of said device and said enclosure.

References Cited in the file of this patent

UNITED STATES PATENTS

| | | |
|---|---|---|
| 2,653,374 | Mathews et al. | Sept. 29, 1953 |
| 2,697,269 | Fuller | Dec. 21, 1954 |
| 2,777,974 | Brattain et al. | Jan. 15, 1957 |
| 2,810,873 | Knott | Oct. 22, 1957 |
| 2,825,014 | Willemse | Feb. 25, 1958 |
| 2,905,873 | Ollendorf et al. | Sept. 22, 1959 |